United States Patent
Becer et al.

(10) Patent No.: US 7,594,210 B2
(45) Date of Patent: Sep. 22, 2009

(54) TIMING VARIATION CHARACTERIZATION

(75) Inventors: Murat R. Becer, Cedar Park, TX (US);
Joao M. Geada, Chelmsford, MA (US);
Isadore T. Katz, Harvard, MA (US);
Lee La France, Bolton, MA (US)

(73) Assignee: CLK Design Automation, Inc.,
Littleton, MA (US)

( * ) Notice: Subject to any disclaimer, the term of this patent is extended or adjusted under 35 U.S.C. 154(b) by 333 days.

(21) Appl. No.: 11/560,553

(22) Filed: Nov. 16, 2006

(65) Prior Publication Data

US 2008/0120584 A1 May 22, 2008

(51) Int. Cl.
*G06F 17/50* (2006.01)
(52) U.S. Cl. .................. 716/6; 716/7; 703/16
(58) Field of Classification Search ........... 716/6, 716/7; 703/16
See application file for complete search history.

(56) References Cited

U.S. PATENT DOCUMENTS

| | | | |
|---|---|---|---|
| 5,416,717 A * | 5/1995 | Miyama et al. ............. 703/14 |
| 5,508,937 A | 4/1996 | Abato | |
| 5,764,533 A * | 6/1998 | deDood ..................... 716/8 |
| 6,298,319 B1 | 10/2001 | Heile | |
| 6,367,056 B1 | 4/2002 | Lee | |
| 6,742,165 B2 | 5/2004 | Lev | |
| 6,745,376 B2 | 6/2004 | Fredrickson | |
| 7,039,882 B2 * | 5/2006 | Rana et al. ................. 716/3 |
| 7,043,382 B2 | 5/2006 | Heo | |
| 7,082,587 B2 | 7/2006 | Chen | |
| 7,117,457 B2 * | 10/2006 | Frenkil .................... 716/2 |
| 7,178,120 B2 | 2/2007 | Hieter | |
| 7,188,325 B1 * | 3/2007 | Evers et al. ................ 716/4 |
| 7,325,215 B2 | 1/2008 | Dinter | |
| 7,424,694 B2 | 9/2008 | Ikeda | |
| 7,454,731 B2 | 11/2008 | Oh | |
| 2002/0032493 A1 | 3/2002 | Kadowaki et al. | |
| 2002/0038446 A1 * | 3/2002 | Ioudovski .................. 716/3 |
| 2003/0140319 A1 * | 7/2003 | Bhattacharya et al. ....... 716/2 |
| 2003/0229410 A1 | 12/2003 | Smith | |
| 2003/0229868 A1 | 12/2003 | White et al. | |
| 2003/0229881 A1 | 12/2003 | White et al. | |
| 2004/0040001 A1 | 2/2004 | Miller et al. | |
| 2004/0049747 A1 * | 3/2004 | Yamasaki et al. ........... 716/4 |
| 2004/0237061 A1 | 11/2004 | Kahng et al. | |
| 2005/0066298 A1 | 3/2005 | Visweswariah | |
| 2005/0071788 A1 | 3/2005 | Bickford et al. | |
| 2005/0138581 A1 * | 6/2005 | Usui ....................... 716/4 |

(Continued)

OTHER PUBLICATIONS

Seeds et al., "Integrated Complementary Transistor Nanosecond Logic," Proceedings of the IEEE, vol. 52, No. 12, Dec. 1964, pp. 1584-1590.*

(Continued)

*Primary Examiner*—Phallaka Kik
(74) *Attorney, Agent, or Firm*—Occhiuti Rohlicek & Tsao LLP

(57) ABSTRACT

A method includes grouping cells with similar topological characteristics into a family of cells, the topological characteristics being defined in part by topological layouts of transistors in the respective cells in the family of cells; and computing data characterizing a relationship between a variability of delay and a magnitude of delay shared among the cells in the family of cells.

29 Claims, 8 Drawing Sheets

U.S. PATENT DOCUMENTS

Figure 1:
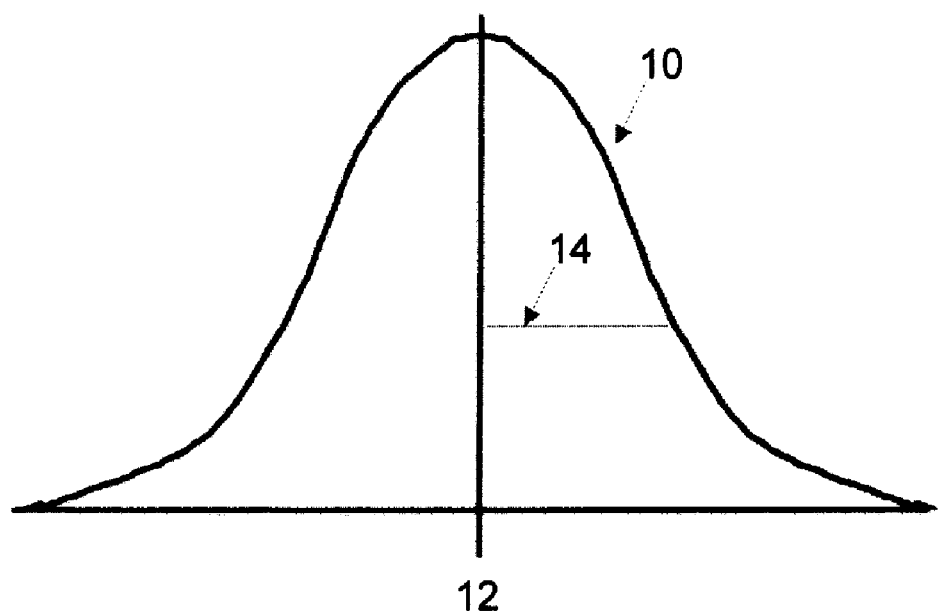

| | | | |
|---|---|---|---|
| 2006/0048081 A1 | 3/2006 | Kiel et al. | |
| 2006/0095237 A1 | 5/2006 | Wang et al. | |
| 2006/0141493 A1 | 6/2006 | West et al. | |
| 2006/0150129 A1 | 7/2006 | Chiu et al. | |
| 2006/0271907 A1* | 11/2006 | Izuha et al. | 716/21 |
| 2007/0006106 A1* | 1/2007 | Bartling et al. | 716/6 |
| 2007/0006109 A1* | 1/2007 | Bartling et al. | 716/11 |
| 2007/0136705 A1 | 6/2007 | Hosono | |
| 2008/0127028 A1 | 5/2008 | Rittman | |

OTHER PUBLICATIONS

"Deep-Submicron Signal Integrity," Magma Design Automation, Inc., White Paper, 2002, pp. 1-17.

Scheffer, "Explicit Computation of Performance as a Function of Process Variation," TAU 2002, Dec. 2-3, 2002, Monterey, CA, pp. 1-24.

Scheffer, "The Count of Monte Carlo," TAU 2004, pp. 1-36.

Orshanksy et al., "Fast Statistical Timing Analysis Handling Arbitrary Delay Correlations," DAC 2004, Jun. 7-11, 2004, San Diego, CA, p. 337-342.

Jess et al., "Statistical Timing for Parametric Yield Prediction of Digital Integrated Circuits," DAC 2003, Jun. 2-6, 2003, Anaheim, CA, p. 932-937.

"Delay Calculation Meets the Nanometer Era", Cadence Design Systems, Inc., Technical Paper, 2004, pp. 1-7.

Kahng, "Static Timing Analysis," ECE260B-CSE241A, Winter 2004, pp. 1-45.

Choi et al., "Timed Pattern Generation for Noise-on-Delay Calculations," DAC 2002, Jun. 10-14, 2002, New Orleans, LA, pp. 1-4.

Shrivastava et al., "Accurate and Efficient Gate-Level Parametric Yield Estimation Considering Correlated Variations in Leakage Power and Performance," DAC 2005, Jun. 13-17, 2005, Anaheim, CA, pp. 1-6.

Le et al., "STAC: Statistical Timing Analysis with Correlation," DAC 2004, Jun. 7-11, 2004, San Diego, CA, p. 343-348.

Agarwal et al., "Statistical Timing Analysis using Bounds and Selective Enumeration", TAU 2002, Dec. 2-3, 2002, Monterey, CA, p. 29-36.

Visweswariah et al., "First-Order Incremental Block-Based Statistical Timing Analysis," DAC 2004, Jun. 7-11, 2004, San Diego, CA, p. 331-336.

Orshanksy et al., "A General Probabilistic Farmework for Worst Case Timing Analysis," DAC 2002, Jun. 10-14, 2002, New Orleans, LA, pp. 1-6.

van Langevelde et al., "PSP Model," Nat. Lab. Unclassified Report NL-TN 2005/00303, Apr. 2005, 72 pages.

Odabasioglu et al., "PRIMA: Passive Reduced-Order Interconnect Macromodeling Algorithm", IEEE Transactions on Computer-Aided Design of Integrated Circuits and Systems, 17:645-654 (1998).

Agarwal et al., "Statistical Timing Analysis for Intra-Die Process Variations with Spatial Correlations," Proceedings of the International Conference on Computer Aided Design (ICCAD'03), Nov. 11-13, 2003, San Jose, CA, p. 900-907.

Agarwal et al., "Computation and Refinement of Statistical Bounds on Circuit Delay," DAC 2003, 348-353 (2003).

Agarwal et al., "Variational Delay Metrics for Interconnect Timing Analysis," DAC 2004, Jun. 7-11, 2004, San Diego, CA, p. 381-384.

Daga et al., "Automated Timing Model Generation," DAC 2002, Jun. 2002, New Orleans, LA, 6 pages.

Liou et al., "False-Path-Aware Statistical Timing Analysis and Efficient Path Selection for Delay Testing and Timing Validation," Jun. 13, 2002, 13 pages.

\* cited by examiner

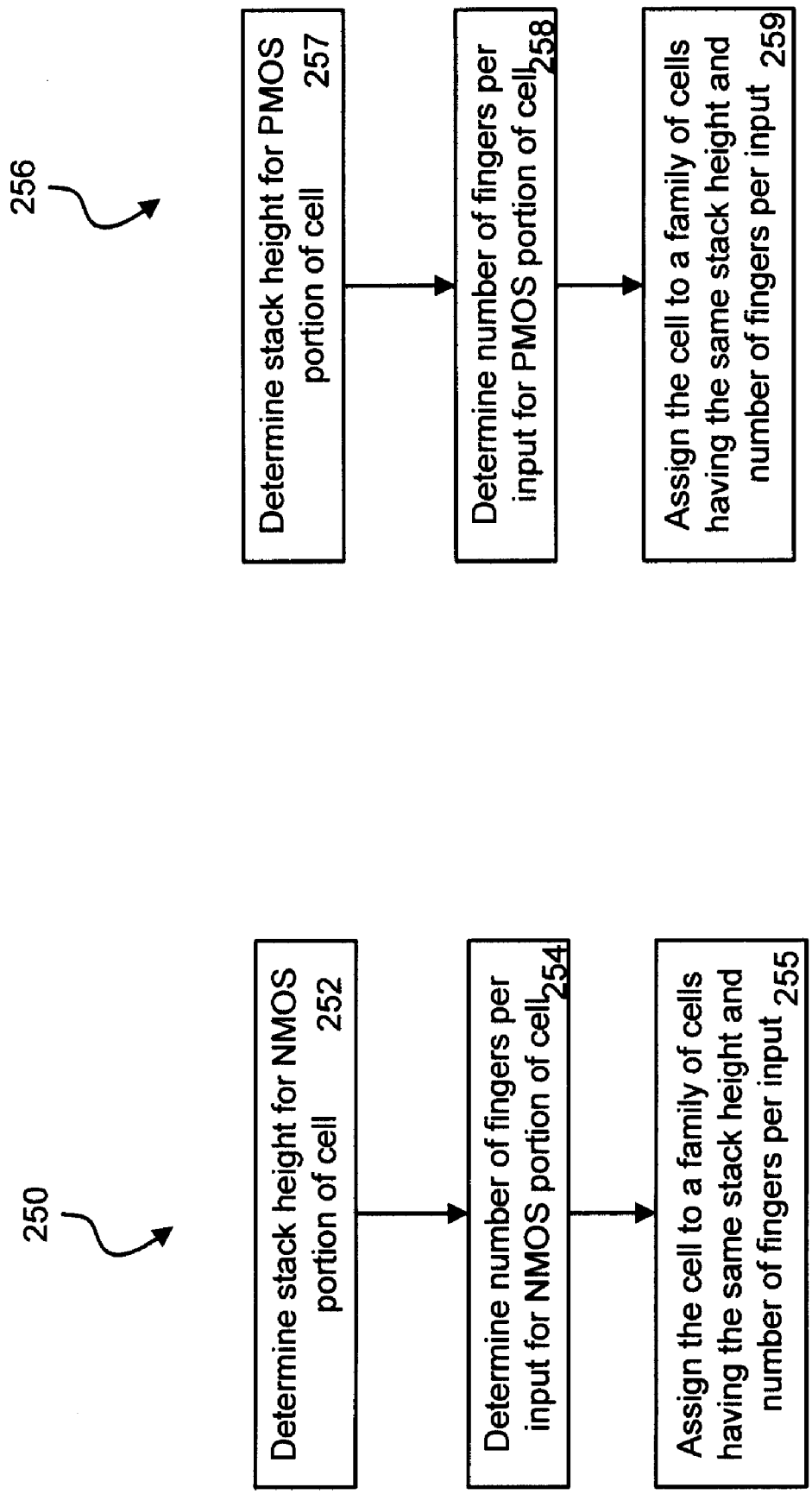

TIMING VARIATION CHARACTERIZATION

TECHNICAL FIELD

The present invention pertains to designing and/or analysis of integrate circuits.

BACKGROUND

Integrated circuit (IC) design can include conversion of a circuit description into a specification of interconnected transistors and other circuit elements laid out on an IC. The design often utilizes techniques such as circuit level simulation, placement and routing of circuit elements, and/or application of design for manufacturing considerations. Simulation can also be used to assess whether the design can achieve performance and timing metrics that are desired for the IC.

Different approaches can be taken to achieving the performance metrics for a manufactured part. In some examples, static performance analysis can be used to determine the performance metrics.

One approach to static analysis uses a worst-case approach, for example, characterizing signal propagation delay through a particular type of logic gate according to a minimum and maximum propagation time. Compound effects, such as propagation delay though a path of gates makes use of the individual worst-case characterizations to derive an overall worst-case path delay. Such an approach may be acceptable when a range of delays through a gate is relatively small compared to typical values and a design based on such an approach may achieve close to optimum performance. However, when the range of variation is relatively large, then a worst-case analysis approach often yields a significantly conservative design.

Figure 2:
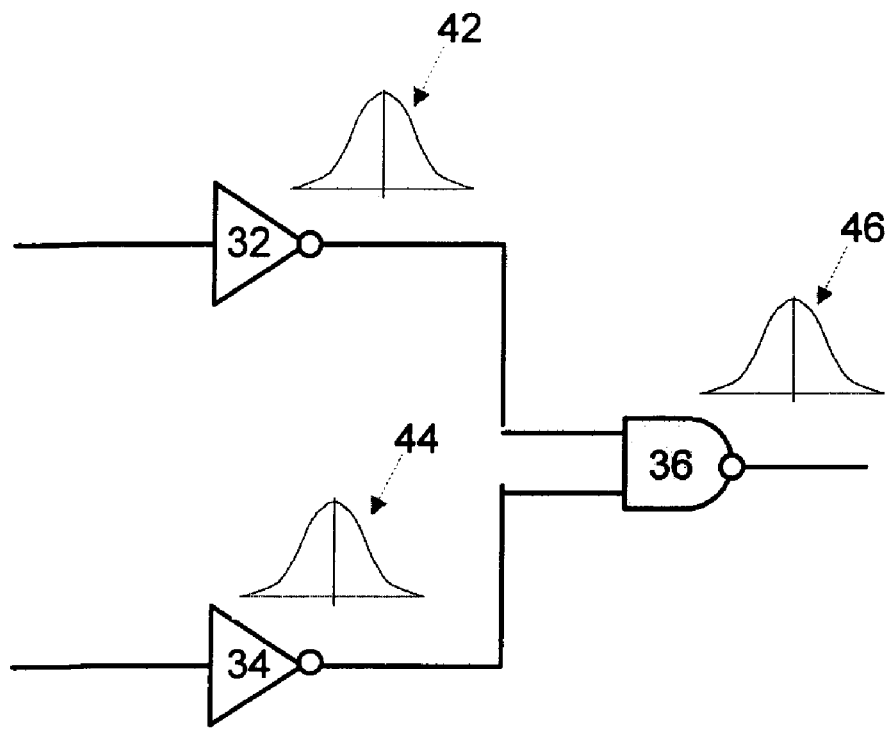

Static analysis approaches can also use statistical distributions rather than worst-case analysis. For example, as shown in FIG. 1, the delay through a gate can be characterized by a statistical distribution 10. The statistical distribution includes a mean delay 12 (e.g., the mean rise time or fall time) and a variation of the delay 14 (e.g., a variation in the rise time or fall time). As shown in FIG. 2, in statistical timing analysis, the compound effect of a path delay through a series of gates (e.g., gates 32, 34, and 36) is computed from the distribution for each of the gates 32, 34, and 36 (e.g., distributions 42, 44, and 46). The total delay for a path through a series of gates can be represented as a distribution based on the statistical distributions for each of the gates.

Static analysis, either worst case or statistically based, uses characterizations of circuit elements such as logic gates that are typically provided by a semiconductor manufacturer to match the fabrication process to be used. For example, the manufacturer of a chip may determine a particular set of parameters that characterize the fabrication process by making electrical and/or optical measurements of test chips. One way of characterizing the transition speed of a gate involves using a ring oscillator composed of such gates on a test chip. Propagation speed through the gate can be determined from the oscillation frequency of the ring oscillator. The manufacturer provides parameters that characterize performance of various circuit elements to the designer of the integrated circuit to enable static analysis of the integrated circuit prior to fabrication.

SUMMARY

In one aspect, in general, a method includes computing data characterizing a relationship between a variability of delay and a magnitude of delay shared among a plurality of cells included in a family of cells, the family of cells being defined by a topological layout of transistors in the cell.

Embodiments can include one or more of the following.

The variability of delay can be a standard deviation of the delay. The magnitude of delay can be a mean delay. The topological layout of transistors in the cell can be based on a stack height of transistors in the cell. The topological layout of transistors in the cell can be based on a number of fingers per input in the cell.

Computing data characterizing variability of delay shared among a plurality of cells included in a family of cells can include computing data characterizing variability of rise time delay shared among a plurality of cells included in a family of cells. The family of cells can be defined by a topological layout of PMOS transistors in the cell.

Computing data characterizing variability of delay shared among a plurality of cells included in a family of cells can include computing data characterizing variability of fall time delay shared among a plurality of cells included in a family of cells. The family of cells is defined by a topological layout of NMOS transistors in the cell.

The method can include performing statistical timing analysis for a plurality of interconnected cells based on the computed data. The method can include determining a delay for each cell in the plurality of cells included in the family of cells. The delay for each cell can be a mean delay. The method can include computing a variation in delay for a particular cell included in the family of cells based on a ratio of the variability of delay for the family of cells and the determined mean delay for the particular cell. The variability in delay can be a standard deviation. At least some of the data characterizing variability of delay shared among a plurality of cells included in a family of cells can include a factor, f, such that a ratio of the variation of delay to the mean variation for a particular cell is approximately constant for the plurality of cells included in the family of cells. The topological layout of the transistors can be independent from the wiring of the transistors to form a gate. A first cell in the family of cells can perform a first logical operation and a second cell in the family of cells can perform a second logical operation, the second logical operation being different from the first logical operation.

Computing data characterizing variability of delay shared among the plurality of cells included in the family of cells can be performed for a plurality of families of cells, each family of the plurality of families of cells having a different topological layout.

In one aspect, in general, a method includes determining a mean delay for a cell, retrieving a factor associated with variability of delay determined based on measurements associated with a representative cell having a similar topological layout as a second cell, and calculating a variation of delay for the second cell based on the retrieved factor and the determined mean of the second cell.

Embodiments can include one or more of the following.

The method can include determining a finger count representing a number of transistors arranged in a substrate in a parallel arrangement and determining a stack count representing a number of transistors arranged in a substrate in a series arrangement. The method can also include grouping cells into layout-based families of cells based on the determined finger count and determined stack count. At least some of the layout-based families of cells can include a first cell configured to perform a first logical function and a second cell configured to perform a second logical function, the first logical function being different than the second logical functions, wherein each family of cells shares a common delay characteristic. The common delay characteristic can be a variability of delay.

In one aspect, in general, a computer program product can be tangibly embodied in a computer readable medium and include instructions to cause a machine to compute data characterizing a relationship between a variability of delay and a magnitude of delay shared among a plurality of cells included in a family of cells, the family of cells being defined by a topological layout of transistors in the cell.

Embodiments can include one or more of the following.

The variability of delay can be a standard deviation of the delay. The magnitude of delay can be a mean delay. The instructions to cause the machine to compute data characterizing variability of delay shared among a plurality of cells included in a family of cells can include instructions to cause a machine to compute data characterizing variability of rise time delay shared among a plurality of cells included in a family of cells. The family of cells can be defined by a topological layout of PMOS transistors in the cell.

The instructions to cause the machine to compute data characterizing variability of delay shared among a plurality of cells included in a family of cells can include instructions to cause a machine to compute data characterizing variability of fall time delay shared among a plurality of cells included in a family of cells. The family of cells can be defined by a topological layout of NMOS transistors in the cell.

The topological layout of transistors in the cell can be based on a stack height of transistors in the cell and a number of fingers per input in the cell. At least some of the data characterizing variability of delay shared among a plurality of cells included in a family of cells includes a factor, f, such that a ratio of the variation of delay to the mean variation for a particular cell is approximately constant for the plurality of cells included in the family of cells.

In one aspect, in general, a computer program product can be tangibly embodied in a computer readable medium and include instructions to cause a machine to determine a mean delay for a cell, retrieve a factor associated with variability of delay determined based on measurements associated with a representative cell having a similar topological layout as a second cell and calculate a variation of delay for the second cell based on the retrieved factor and the determined mean of the second cell.

DRAWINGS

Figure 3:
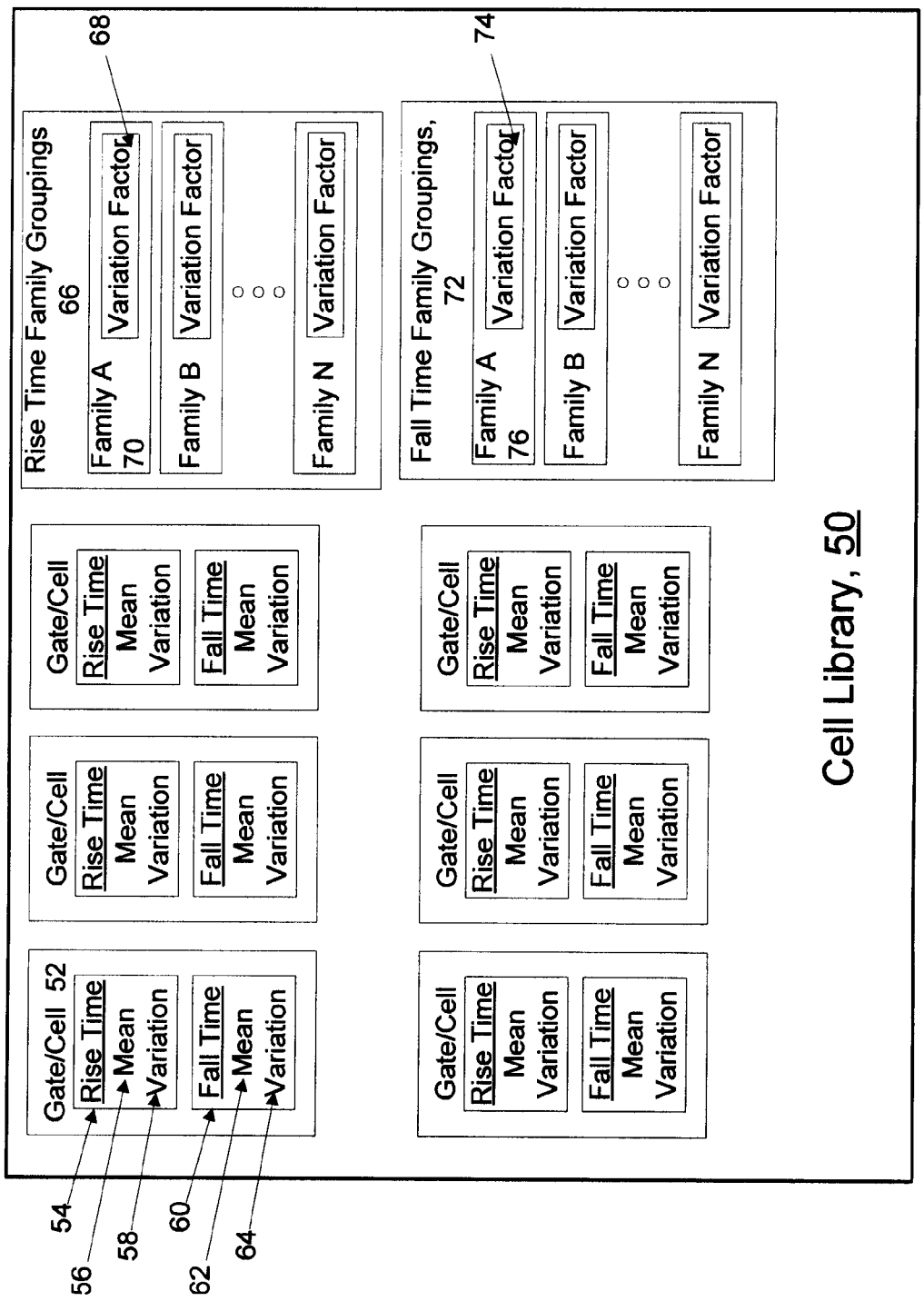
Figure 4:
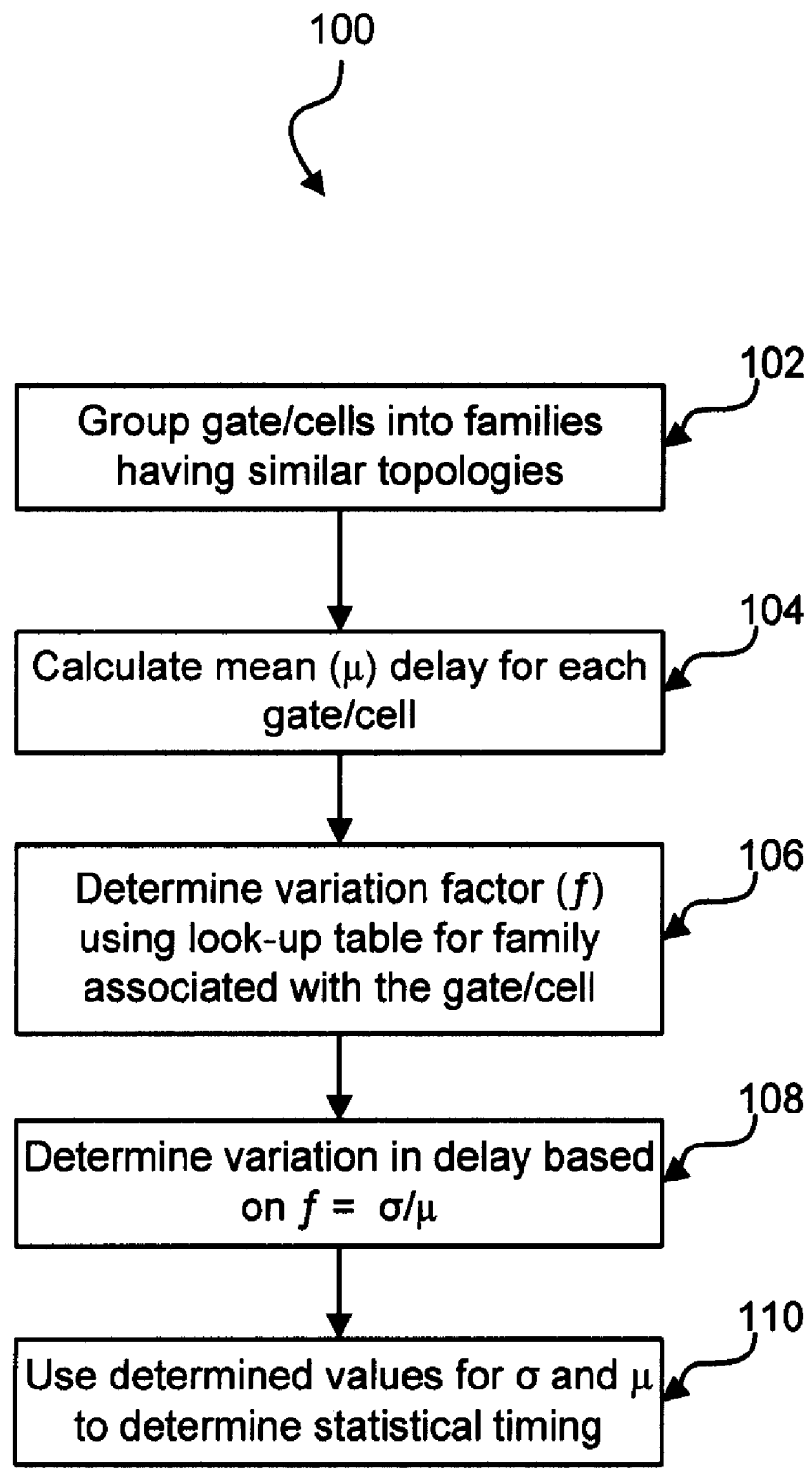
Figure 5:
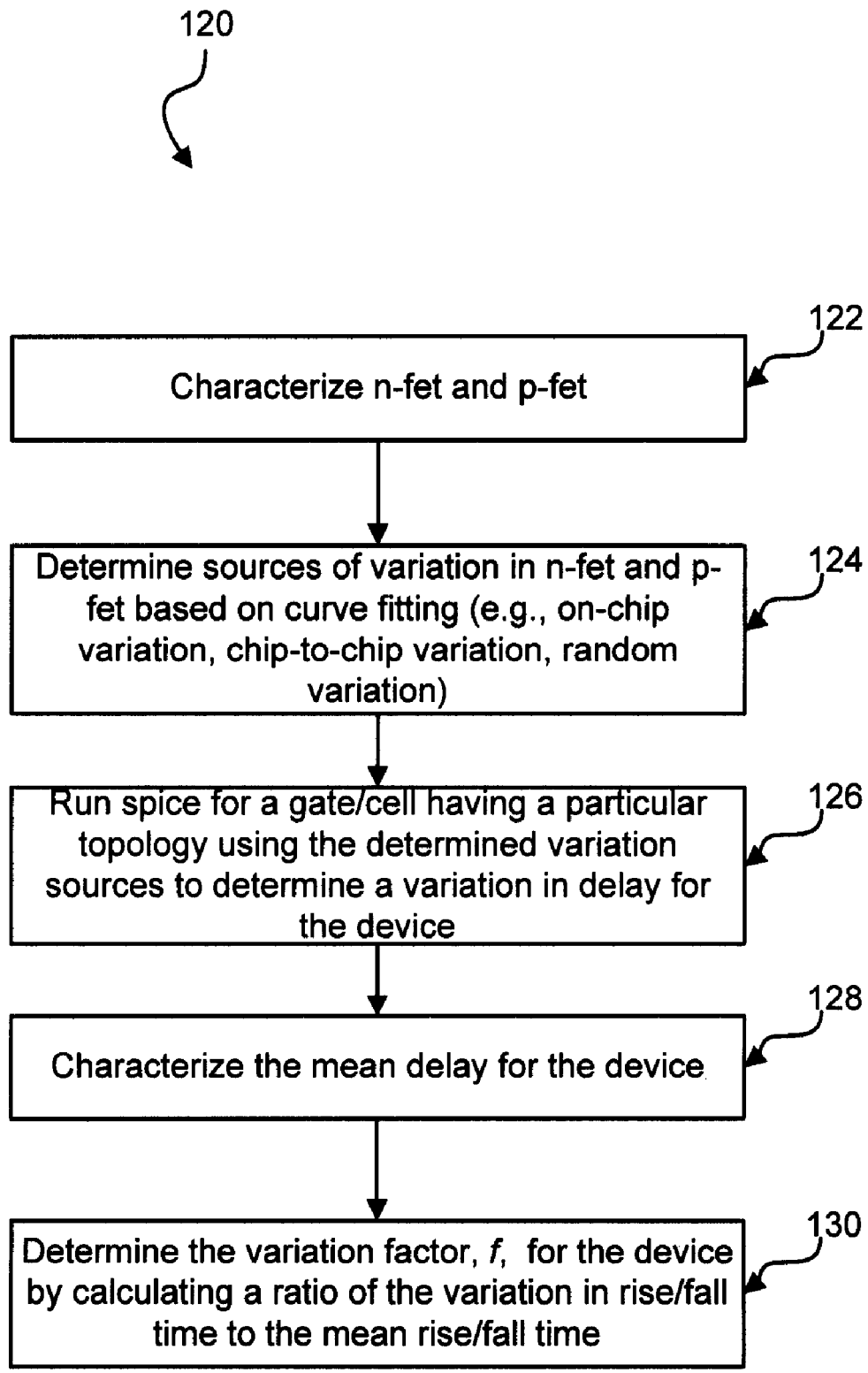
Figure 8B:
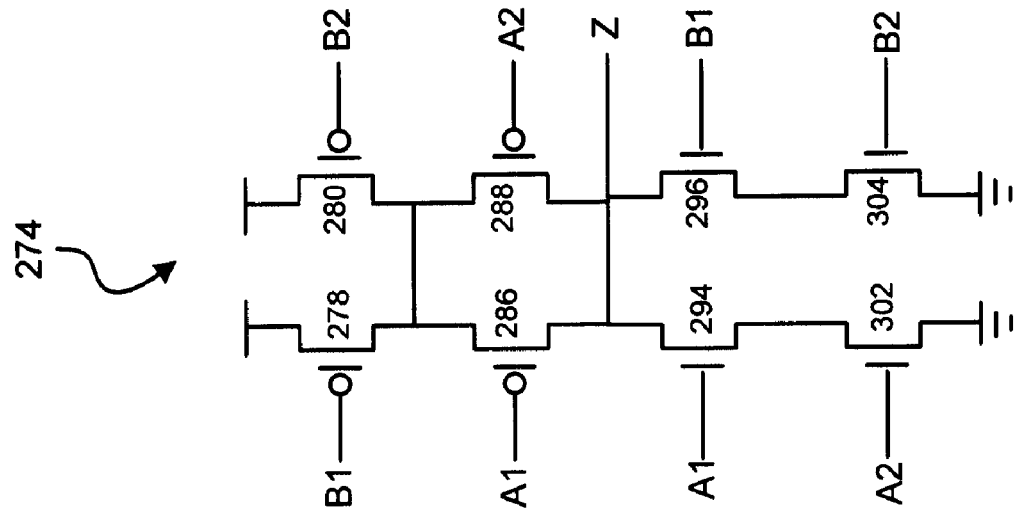
Figure 8A:
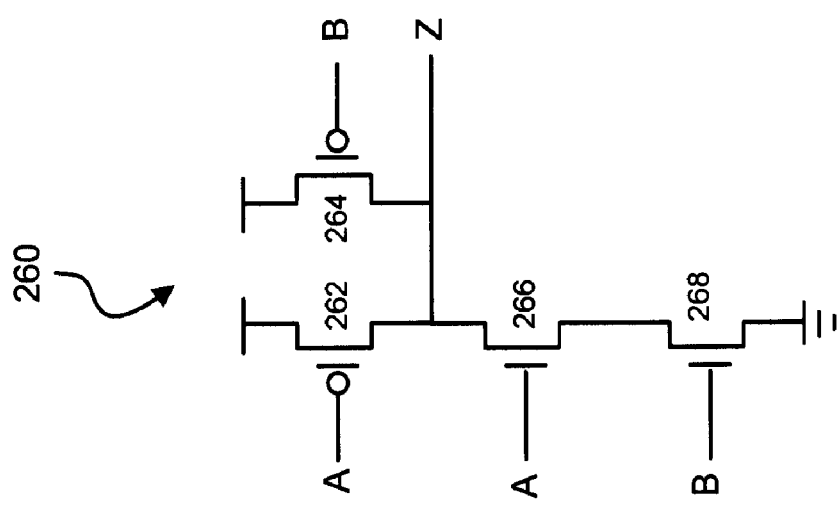
Figures 9A, 9B:
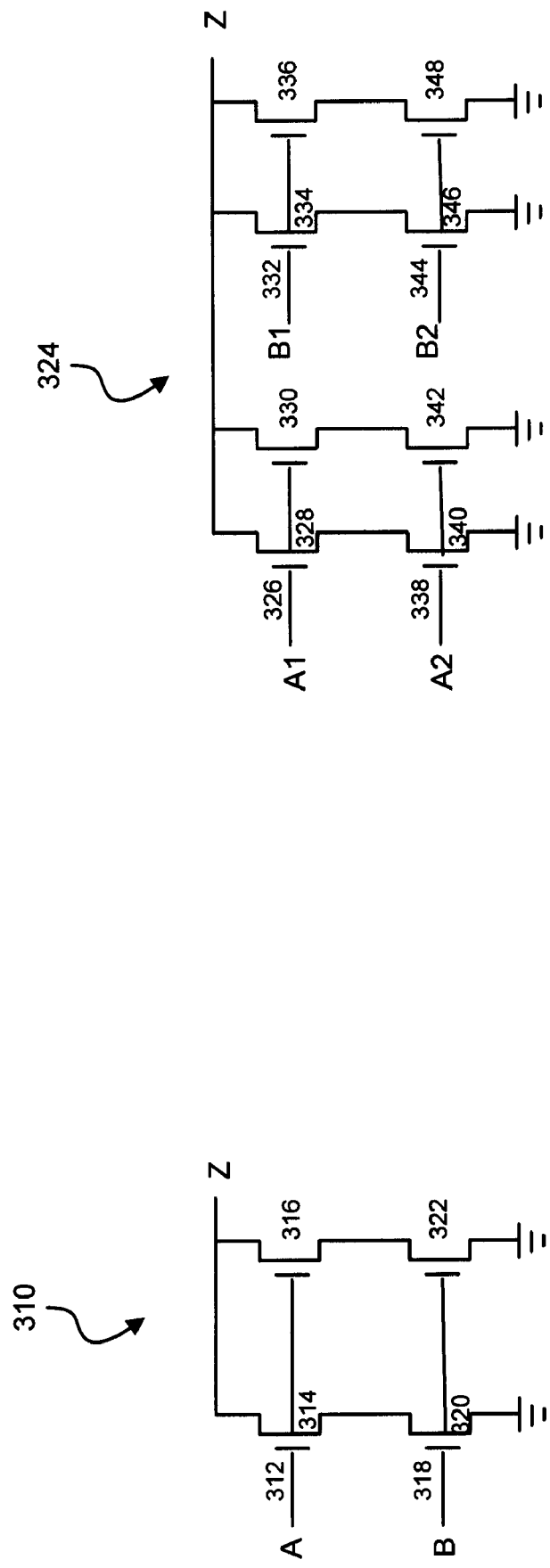
Figure 10B:
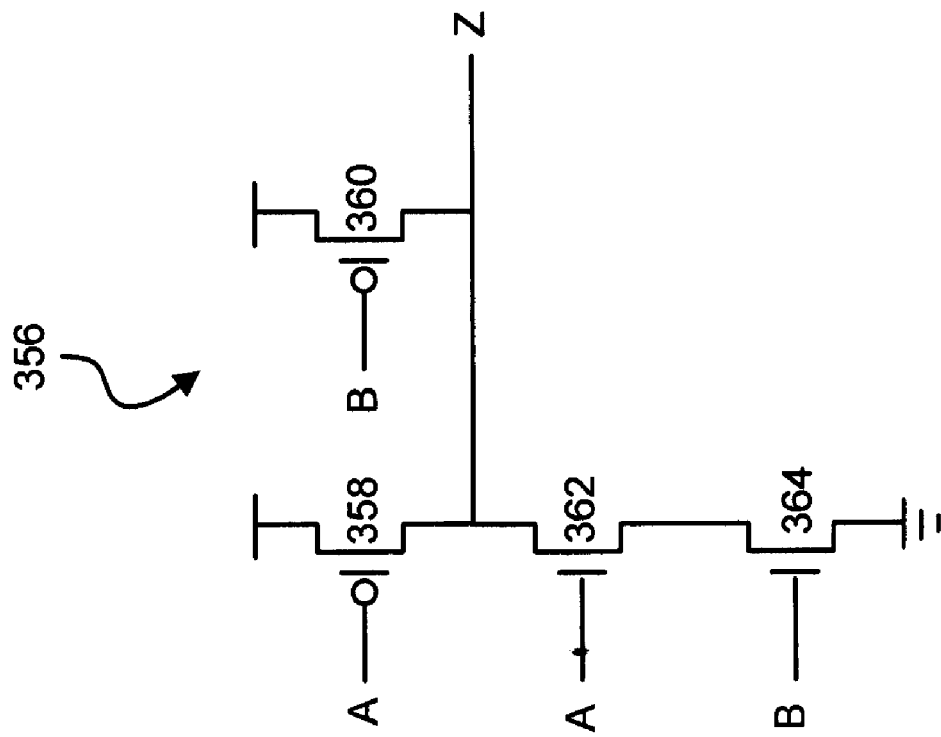
Figure 10A:
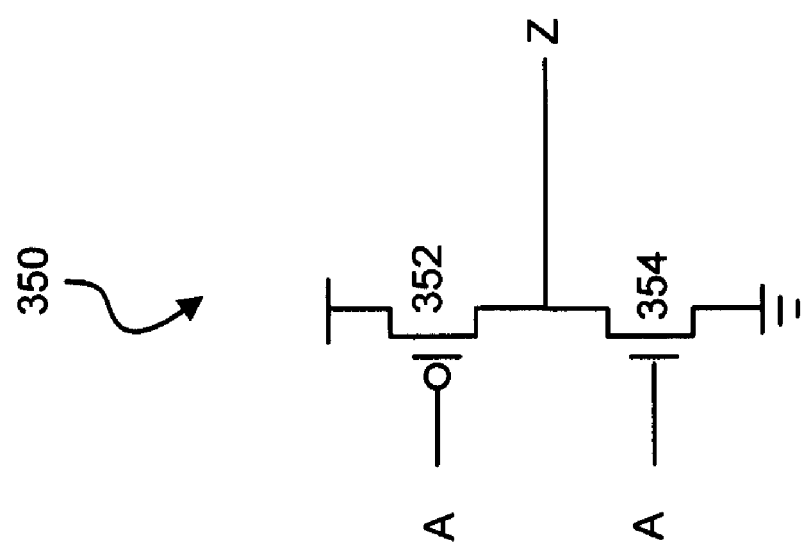

FIG. 1 is a diagram of a statistical distribution.
FIG. 2 is a diagram of an exemplary circuit arrangement.
FIG. 3 is a block diagram of a cell library.
FIG. 4 is a flow chart of a process for generating and using a mean delay and a variation in delay for static timing analysis.
FIG. 5 is a flow chart of a process for determining a variation factor.
FIG. 6 is a flow chart of a process for determining an NMOS family.
FIG. 7 is a flow chart of a process for determining a PMOS family.
FIGS. 8A-8B are circuit diagrams.
FIGS. 9A-9B are circuit diagrams.
FIGS. 10A-10B are circuit diagrams.

DESCRIPTION

Referring to FIG. 3, an approach to integrated circuit (IC) design makes use of statistically-based static analysis, with parameters used for a particular component (e.g., logic gate) in the static analysis being stored in a cell library 50. The cell library 50 includes information about various gates/cells 52 that are used to build an integrated circuit. In general, an IC designer uses conventional automate or semi-automated electronic design automation (EDA) tools in an IC design process to synthesize a circuit using the gates/cells 52 in the cell library 50.

The cell library 50 stores information about statistical timing distributions for each gate/cell 52 included in the cell library 50. Exemplary information about the statistical distribution for a gate/cell 52 can include information about the mean rise time 56, the variation in the rise time 58 (e.g., the standard deviation), the mean fall time 62, and the variation in the fall time 64 (e.g., the standard deviation). In general, the rise time for a gate/cell 52 refers to the delay of a transition of the gate/cell 52 from a low voltage level to a high voltage level and the fall time for a gate/cell 52 refers to the delay of a transition of the gate/cell 52 from a high voltage level to a low voltage level. The mean and the variation in rise time and/or fall time can each be expressed as a single term or as a family of multiple terms related as sensitivities to various physical parameters of the chip, including, but not limited to: location on die, layer, die, and/or location on wafer.

After generating an IC design, the designer applies analysis tolls, including a static analysis, to determine predicted performance for the device. The static analysis uses statistical distributions for each gate/cell 52 to determine the performance of the IC. The total delay for a path through a series of gates can calculated based on the information about the mean rise rime 56, the variation in the rise time 58, the mean fall time 62, and the variation in the fall time 64 for each of the gates in the series of gates.

The cell library 50 can include a large number of gates/cells 52. For example, cell libraries often include in excess of five hundred gates/cells and the number of gates/cells continues to increase as the complexity of integrated circuits increases. Previously, in order to determine the statistical distributions (e.g., rise time, fall time, and variation in rise and fall times) for each gate/cell in a cell library, simulations and/or device measurements were performed to determine both the mean and the variation in the rise time and fall time for each gate/cell in the cell library.

In order to reduce the time and/or effort required to generate the statistical distributions for each gate/cell 52, the cell library 50 includes a database that stores information about rise time family groupings 66 and fall time family groupings 72. As described to follow, the rise time and fall time family groupings 66 and 72 can be used to determine the rise time and fall time variation respectively for a gate/cell 52 based on information about the family and a mean rise/fall time for the gate/cell 52. The rise time family groupings 66 and fall time family groupings 72 each include multiple groupings of gates/cells (referred to herein as families) that exhibit related timing characteristics.

The different families for the rise rime family groupings 66 categorize gates/cells according to the topological layout of the transistors that form a gate/cell such that gates/cells with similar topological characteristics are included in the same family. More particularly, gates/cells with similarly arranged PMOS stacks will be included in the same family for the rise time family groupings 66 (as described in more detail below). Due to the groupings of the gates/cells according to their topological layout, the gates/cells in each family for the rise time family groupings 66 share similar rise time characteristics such that the variation in the rise-time delay ($\sigma_{rise}$) for a gate/cell divided by the mean delay ($\mu_{rise}$) for the gate/cell is approximately the same (e.g., within about 5%) for each gate/cell in a family of cells. The ratio of $\sigma_{rise}/\mu_{rise}$ is referred to as a variation factor, $f_{rise}$. Thus, for each gate/cell in a family of cells for the rise time family groupings $f_{rise}=\sigma_{rise}/\mu_{rise}$ where the $f_{rise}$ is approximately the same for each gate/cell 52 in the family.

The different families for the fall time family groupings 72 categorize gates/cells according to the topological layout of the transistors that form a gate/cell such that gates/cells with similar topological characteristics are included in the same family. More particularly, gates/cells with the similarly arranged NMOS stacks will be included in the same family for the fall time family groupings 72 (as described in more detail below). Due to the grouping of the gates/cells into families according to the topological layout of the transistors, the gates/cells 52 in each family of cells for the fall time family groupings 72 share similar fall time characteristics such that the variation in the fall-time delay ($\sigma_{fall}$) for a gate/cell divided by the mean fall-time delay ($\mu_{fall}$) for the gate/cell is approximately the same (e.g., within about 5%) for each gate/cell in a family of cells. The ratio of $\sigma_{fall}/\mu_{fall}$ is referred to herein as a variation factor, $f_{fall}$. Thus, for each gate/cell in a family of cells for the fall time family groupings $f_{fall}=\sigma_{fall}/\mu_{fall}$ where the $f_{fall}$ is approximately the same for each gate/cell in the family.

Since the gates/cells 52 in the cell library 50 are grouped into families having similar topologies, it is not necessary to individually simulate or measure each gate/cell 52 in a family to determine the variation in the delay ($\sigma_{rise}$ or $\sigma_{fall}$) for each gate/cell if the mean delay for the game is known, for example, by measurement or simulation. FIG. 4 shows a process 100 for determining the variation in the delay ($\sigma_{rise}$ or $\sigma_{fall}$) based on the mean delay ($\mu_{rise}$ or $\mu_{fall}$) and the variation factor ($f_{rise}$ or $f_{fall}$) for the gate/cell. Process 100 includes grouping the gates/cells into rise-time and fall-time families based on their topologies (102). For each gate/cell a mean rise time and a mean fall time delay are determined using simulations and/or measurements (104). Process 100 determines the variation factors, $f_{rise}$ or $f_{fall}$, for the gate/cell using a look-up table in the cell library 50 based on the rise time and fall time families with which the gate/cell is associated (106). Since both the mean delay ($\mu_{rise}$ or $\mu_{fall}$) and the variation factor ($f_{rise}$ or $f_{fall}$) are known for the gate/cell, process 100 calculates the variation in the delay ($\sigma_{rise}$ or $\sigma_{fall}$) for the gate/cell based on the following equations (108)

$$f_{rise}=\sigma_{rise}/\mu_{rise}$$

$$f_{fall}=\sigma_{fall}/\mu_{fall}.$$

The values of $\mu_{rise}$, $\mu_{rise}$, $\sigma_{rise}$, and $\sigma_{fall}$ can be subsequently used to determine statistical timing for a series of gates/cells in an integrated circuit (110).

Referring to FIG. 5, in order to calculate the estimated variation in rise time or fall time for a gate/cell in a family, a known rise time or fall time variation factor, respectively, for the family is used. A process 120 for determining the variation factor for a family of gates/cells includes determining the variation for a single gate/cell in the family. The variation characteristics can be determined in a variety of ways including calculation or simulation based methods and measurement based methods. For example, in some implementations, the variation for a single gate/cell can be determined by characterizing the n-doped transistors and p-doped transistors (122), determining the sources of variation in the n-doped and p-doped devices based on curve fitting of actual devices (124), and using a simulation tool (e.g., SPICE) to determine the variation for a particular arrangement of n-doped and p-doped devices based on the estimated variations for the transistors (126). Process 120 also includes characterizing the mean delay for the gate/cell (128). The mean delay can be estimated using a simulation tool (e.g., SPICE) or can be measured from a fabricated device. Once the mean delay and the estimated variation (in either rise time or fall time) are known for the gate/cell, the variation factor is calculated by taking the ratio of the variation in rise/fall time and the mean (130). More particularly, in order to determine the rise time variation factor, a ratio of the variation in rise time to the mean rise time is calculated and in order to determine the fall time variation factor, a ratio of the variation in fall time to the mean fall time is calculated.

As described above, the different rise-time and fall-time families are used to categorize gates/cells according to the topological layout of the transistors included in the gates/cells. Gates/cells that are included in the same family for rise-time or fall-time share similar variation characteristics such that $f=\sigma/\mu$ for gates/cells in the same family. In general, each gate/cell is typically grouped into two different families. The first grouping is based on the topological characteristics of the NMOS stack in the gate/cell and the second grouping is based on the topological characteristics of the PMOS stack in the cell. The topological layout characteristics that are used to determine the families to which a particular gate/cell belongs are based on the connection of transistors forming a potential current path from the output to either a low or high voltage node. The topological characteristics that are used to determine the families to which a particular gate/cell belongs are independent of the wiring of the gates of the various transistors within the cell. As such, the families are not based on the logic function performed by the gate/cell.

Every gate/cell includes one or more transistors and has one or more inputs and an output. The output is typically connected to one or more stacks of transistors. A stack of transistors refers to one or more transistors connected in series between the output and a high/low voltage. In a stack of transistors if all transistors are 'on', current can flow between the high/low voltage and the output. However, if any one of the transistors in the stack of transistors is 'off' current flow is prohibited between the high/low voltage and the output. The gates/cells are grouped into families based on the number of transistors in each stack (also referred to as stack height) and the number of parallel transistors per input (also referred to as the number of fingers).

The stack height and number of fingers per input are used to group the gates/cells into families. In general, the stack height an number of fingers per input in the NMOS portion of the gate/cell is used to group the gate/cell into a family for fall time variation while the stack height and number of fingers per input in the PMOS portion of the gate/cell is used to group the gate/cell into a family for rise time variation.

FIG. 6 shows a process 250 for assigning a gate/cell to a family for fall time variation. Process 250 includes determining the stack height for the transistor stack(s) in the NMOS portion of the gate/cell (252). Process 250 also includes determining the number of fingers per input for the transistor stacks in the NMOS portion of the gate/cell (254). Based on the determined stack height and number of fingers per input, process 250 assigns the gate/cell to a family of cells having the same stack height and number of fingers per input (255).

FIG. 7 shows a process 256 for assigning a gate/cell to a family for rise time variation. Process 256 includes determining the stack height for the transistor stack(s) in the PMOS portion of the gate/cell (257). Process 256 also includes determining the number of fingers per input for the transistor stacks in the PMOS portion of the gate/cell (258). Based on the determined stack height and number of fingers per input, process 256 assigns the gate/cell to a family of cells having the same PMOS stack height and number of fingers per input (259).

FIGS. 8A and 8B show exemplary circuit diagrams of two gates/cells in the same NMOS (fall-time) family but different PMOS (rise-time) families. FIG. 8A shows a 2×1 NAND gate 260. The NAND gate includes two PMOS transistors 262 and 264 and two NMOS transistors 266 and 268. The PMOS portion of the NAND gate 260 has a stack height of one and one finger per input. The NMOS portion of the NAND gate 260 has a stack height of two and one finger per input. FIG. 8B shows a 2×1 AND-OR-Invert (AOI) gate 274. Gate 274 includes four PMOS transistors 278, 280, 286, and 288 and four NMOS transistors 294, 296, 302, and 304. The PMOS portion of the AOI gate 274 has a stack height of two and one finger per input. The NMOS portion of the AOI gate 274 has a stack height of two and one finger per input. The stack heights and number of fingers per input for both the NMOS and PMOS portions NAND gate 260 and AOI gate 274 are summarized in the table below.

|  | NAND gate 260 | AOI gate 274 |
| --- | --- | --- |
| PMOS stack height | 1 | 2 |
| PMOS number of fingers per input | 1 | 1 |
| NMOS stack height | 2 | 2 |
| NMOS number of fingers per input | 1 | 1 |

Since the PMOS stack height and number of fingers per input are not the same for the NAND gate 260 and AOI gate 274, and NAND gate 260 and AOI gate 274 are not in the same PMOS family for rise time variation. On the other hand, the NMOS stack height and number of fingers per input are the same for the NAND gate 260 and AOI gate 274. As such, the NAND gate 260 and AOI gate 274 are in the same NMOS family for fall time variation.

FIGS. 9A and 9B show exemplary circuit diagrams of two gates/cells in the same NMOS (fall-time) family. FIG. 9A shows a 2×2 NAND gate 310. The NAND gate includes four NMOS transistors 314, 316, 320, and 322. The NMOS portion of the NAND gate 310 has a stack height of two and two fingers per input (e.g., the gates of transistors 314 and 316 are both tied to input 312 and the gates of transistors 320 and 322 are both tied to input 318). FIG. 9B shows an AND-OR-Invert (AOI) gate 324. Gate 274 includes eight NMOS transistors 328, 330, 334, 336, 340, 342, 346, and 348. The NMOS portion of the AOI gate 324 has a stack height of two and two fingers per input (e.g., the gates of transistors 328 and 330 are both tied to input 326, the gates of transistors 334 and 336 are both tied to input 332, the gates of transistors 340 and 342 are both tied to input 338, and the gates of transistors 346 and 348 are both tied to input 344). The stack heights and number of fingers per input for NAND gate 310 and AOI gate 324 are summarized in the table below.

|  | NAND gate 310 | AOI gate 324 |
| --- | --- | --- |
| PMOS stack height | n/a | n/a |
| PMOS number of fingers per input | n/a | n/a |
| NMOS stack height | 2 | 2 |
| NMOS number of fingers per input | 2 | 2 |

The NMOS stack height and number of fingers per input are the same for the NAND gate 310 and AOI gate 324. As such, the NAND gate 310 and AOI gate 324 are in the same NMOS family for fall time variation.

FIGS. 10A and 10B show exemplary circuit diagrams of two gates/cells in the same PMOS (rise-time) family but different NMOS (fall-time) families. FIG. 10A shows an inverter gate 350. The inverter gate 350 includes one PMOS transistor 352 and one NMOS transistor 354. The PMOS portion of the inverter gate 350 has a stack height of one and one finger per input. The NMOS portion of the inverter gate 350 has a stack height of one and one finger per input. FIG. 10B shows a 2×1 NAND gate 356. NAND gate 356 includes two PMOS transistors 358 and 360 and two NMOS transistors 362 and 364. The PMOS portion of the NAND gate 356 has a stack height of one and one finger per input. The NMOS portion of the NAND gate 356 has a stack height of two and one finger per input. The stack heights and number of fingers per input for Inverter gate 350 and NAND gate 356 are summarized in the table below.

|  | Inverter gate 350 | NAND gate 356 |
| --- | --- | --- |
| PMOS stack height | 1 | 1 |
| PMOS number of fingers per input | 1 | 1 |
| NMOS stack height | 1 | 2 |
| NMOS number of fingers per input | 1 | 1 |

Since the NMOS stack height and number of fingers per input are not the same for the Inverter gate 350 and NAND gate 356, the Inverter gate 350 and NAND gate 356 are not in the same NMOS family for fall time variation. On the other hand, the PMOS stack height and number of fingers per input are the same for the Inverter gate 350 and NAND gate 356. As such, the Inverter gate 350 and NAND gate 356 are in the same PMOS family for rise time variation.

In some situations, a manufacturing process will change during the use of a particular generation of the process (e.g., 45 nm generation, 65 nm generation, 90 nm generation etc.). The majority of these changes will have a correlated effect on delay and variance such that, for all cell families, the variance/mean delay ration remains unchanged. In such cases the previously established characterized ratios in the library can continue to be used without requiring any further variance characterization effort. Variance characterization will only be required if the ratio is changed as a consequence of the process improvement (e.g., due to improved printing accuracy and/or reduction of random error sources) then variance needs to again to re-characterized for the various cell families.

Embodiments described above, and other embodiments, are within the scope of the appended claims.

What is claimed is:

1. A method comprising:
grouping cells with similar topological characteristics into a family of cells, the topological characteristics being defined in part by topological layouts of transistors in the respective cells in the family of cells; and
computing by a computer, data characterizing a relationship between a variability of delay and a magnitude of delay shared among the cells in the family of cells.

2. The method of claim 1 wherein the variability of delay comprises a standard deviation of the delay.

3. The method of claim 1 wherein the magnitude of delay comprises a mean delay.

4. The method of claim 1 wherein computing data characterizing variability of delay shared among a plurality of cells included in a family of cells comprises computing data characterizing variability of rise time delay shared among a plurality of cells included in a family of cells.

5. The method of claim 4 wherein the family of cells is defined by a topological layout of PMOS transistors in the cell.

6. The method of claim 1 wherein computing data characterizing variability of delay shared among a plurality of cells included in a family of cells comprises computing data characterizing variability of fall time delay shared among a plurality of cells included in a family of cells.

7. The method of claim 6 wherein the family of cells is defined by a topological layout of NMOS transistors in the cell.

8. The method of claim 1, wherein the topological layout of transistors in the cell comprises a stack height of transistors in the cell.

9. The method of claim 1, wherein the topological layout of transistors in the cell comprises a number of fingers per input in the cell.

10. The method of claim 1, further comprising performing statistical timing analysis for a plurality of interconnected cells based on the computed data.

11. The method of claim 1, further comprising determining a delay for each cell in the plurality of cells included in the family of cells.

12. The method of claim 11, wherein the delay for each cell comprises a mean delay.

13. The method of claim 12, further comprising computing a variation in delay for a particular cell included in the family of cells based on a ratio of the variability of delay for the family of cells and the determined mean delay for the particular cell.

14. The method of claim 13, wherein the variability in delay comprises a standard deviation.

15. The method of claim 1, wherein at least some of the data characterizing variability of delay shared among a plurality of cells included in a family of cells comprises a factor, f, such that a ratio of the variation of delay to the mean variation for a particular cell is approximately constant for the plurality of cells included in the family of cells.

16. The method of claim 1, wherein the topological layout of the transistors is independent from the wiring of the transistors to form a gate.

17. The method of claim 1, wherein a first cell in the family of cells performs a first logical operation and a second cell in the family of cells performs a second logical operation, the second logical operation being different from the first logical operation.

18. The method of claim 1, wherein the computing data characterizing variability of delay shared among the plurality of cells included in the family of cells is performed for a plurality of families of cells, each family of the plurality of families of cells having a different topological layout.

19. A method comprising:
determining a mean delay for a cell;
retrieving a factor associated with variability of delay determined based on measurements associated with a representative cell having a similar topological layout as a second cell; and
calculating by a computer a variation of delay for the second cell based on the retrieved factor and the determined mean of the second cell.

20. A method for grouping cells into families, the method comprising:
determining a finger count representing a number of transistors arranged in a substrate in a parallel arrangement;
determining a stack count representing a number of transistors arranged in a substrate in a series arrangement; and
grouping by a computer cells into layout-based families of cells based on the determined finger count and determined stack count, wherein at least some of the layout-based families of cells include a first cell configured to perform a first logical function and a second cell configured to perform a second logical function, the first logical function being different than the second logical functions, wherein each family of cells shares a common delay characteristic.

21. The method of claim 20, wherein the common delay characteristic comprises a variability of delay.

22. A computer program product tangibly embodied in a computer readable medium comprising instructions to cause a machine to:
compute data characterizing a relationship between a variability of delay and a magnitude of delay shared among a plurality of cells included in a family of cells,
wherein the plurality of cells included in the family of cells possess similar topological characteristics, the topological characteristics being defined in part by topological layouts of transistors in the respective cells in the family of cells.

23. The computer program product of claim 22 wherein the variability of delay comprises a standard deviation of the delay.

24. The computer program product of claim 22 wherein the magnitude of delay comprises a mean delay.

25. The computer program product of claim 22 wherein the instructions to cause the machine to compute data characterizing variability of delay shared among a plurality of cells included in a family of cells comprise instructions to cause a machine to compute data characterizing variability of rise time delay shared among a plurality of cells included in a family of cells, wherein the family of cells is defined by a topological layout of PMOS transistors in the cell.

26. The computer program product of claim 22 wherein the instructions to cause the machine to compute data characterizing variability of delay shared among a plurality of cells included in a family of cells comprise instructions to cause a machine to compute data characterizing variability of fall time delay shared among a plurality of cells included in a family of cells, wherein the family of cells is defined by a topological layout of NMOS transistors in the cell.

27. The computer program product of claim 22, wherein the topological layout of transistors in the cell comprises:
a stack height of transistors in the cell; and
a number of fingers per input in the cell.

28. The computer program product of claim 22, wherein at least some of the data characterizing variability of delay shared among a plurality of cells included in a family of cells comprises a factor, f, such that a ratio of the variation of delay to the mean variation for a particular cell is approximately constant for the plurality of cells included in the family of cells.

29. A computer program product tangibly embodied in a computer readable medium comprising instructions to cause a machine to:
determine a mean delay for a cell;
retrieve a factor associated with variability of delay determined based on measurements associated with a representative cell having a similar topological layout as a second cell; and
calculate a variation of delay for the second cell based on the retrieved factor and the determined mean of the second cell.

* * * * *